United States Patent [19]

Shibuya

[11] Patent Number: 4,906,998

[45] Date of Patent: Mar. 6, 1990

[54] RADIO-FREQUENCY ANECHOIC CHAMBER

[75] Inventor: Shigekazu Shibuya, Yokohama, Japan

[73] Assignee: Yoshiaki Kaneko, Kawasaki, Japan

[21] Appl. No.: 342,326

[22] Filed: Apr. 24, 1989

[30] Foreign Application Priority Data

Apr. 28, 1988 [JP] Japan .................. 63-105900

[51] Int. Cl.$^4$ ........................... H01Q 17/00
[52] U.S. Cl. ......................... 342/4; 342/165
[58] Field of Search .............. 342/4, 1, 5, 7, 165, 342/166

[56] References Cited

U.S. PATENT DOCUMENTS

| | | | |
|---|---|---|---|
| 3,113,271 | 12/1963 | Buckley | 342/4 |
| 3,120,641 | 2/1964 | Buckley | 342/4 |
| 3,308,463 | 3/1967 | Emerson | 342/4 |
| 3,571,479 | 3/1971 | Horattas et al. | 342/4 |
| 3,806,943 | 4/1974 | Holloway | 342/4 |
| 4,218,683 | 8/1980 | Hemming | 342/4 |
| 4,507,660 | 3/1985 | Hemming | 342/4 |

*Primary Examiner*—Thomas H. Tarcza
*Assistant Examiner*—John B. Sotomayor
*Attorney, Agent, or Firm*—Oblon, Spivak, McClelland, Maier & Neustadt

[57] ABSTRACT

A radio-frequency unechoic chamber (electric wave nonreflecting room) is disclosed. The radio-frequency unechoic chamber comprises radiowave reflectors which are provided on all inside of peripheral walls whose upper portion is open and a screen to cut off reflected waves which is arranged between an antenna and the mounting table of a test apparatus and which has a gap for allowing only direct waves from said antenna to pass. The radio-frequency unechoic chamber further may comprise a radiowave reflector which forms a triangular prism together with the floor surface and whose longitudinal direction coincides with the direction connecting the antenna and the mounting table of the test apparatus and which is provided on the floor surface, a radiowave reflector which forms a triangular prism together with the ceiling surface and whose longitudinal direction coincides with the direction connecting the antenna and the mounting table of the test apparatus and which is provided under the ceiling surface, and radiowave absorbers provided under the ceiling surface where said radiowave reflector is not provided.

2 Claims, 4 Drawing Sheets

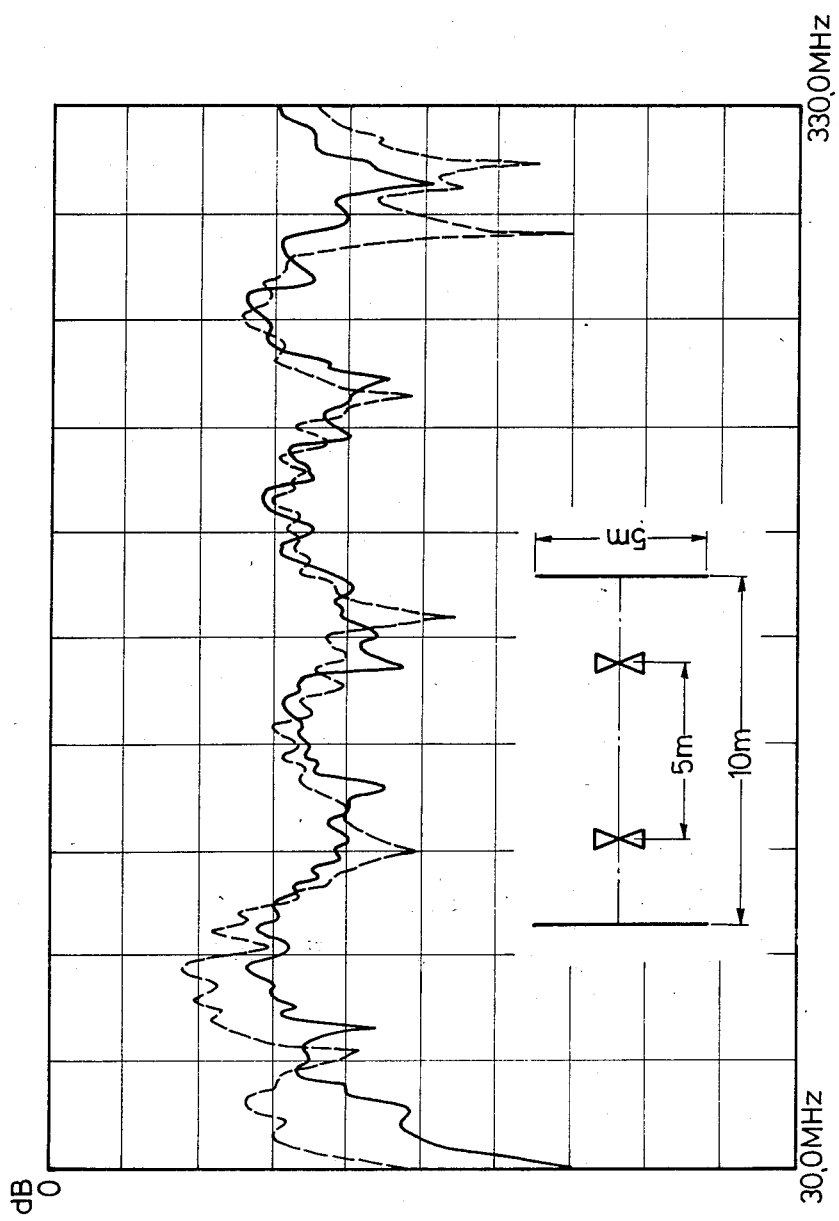

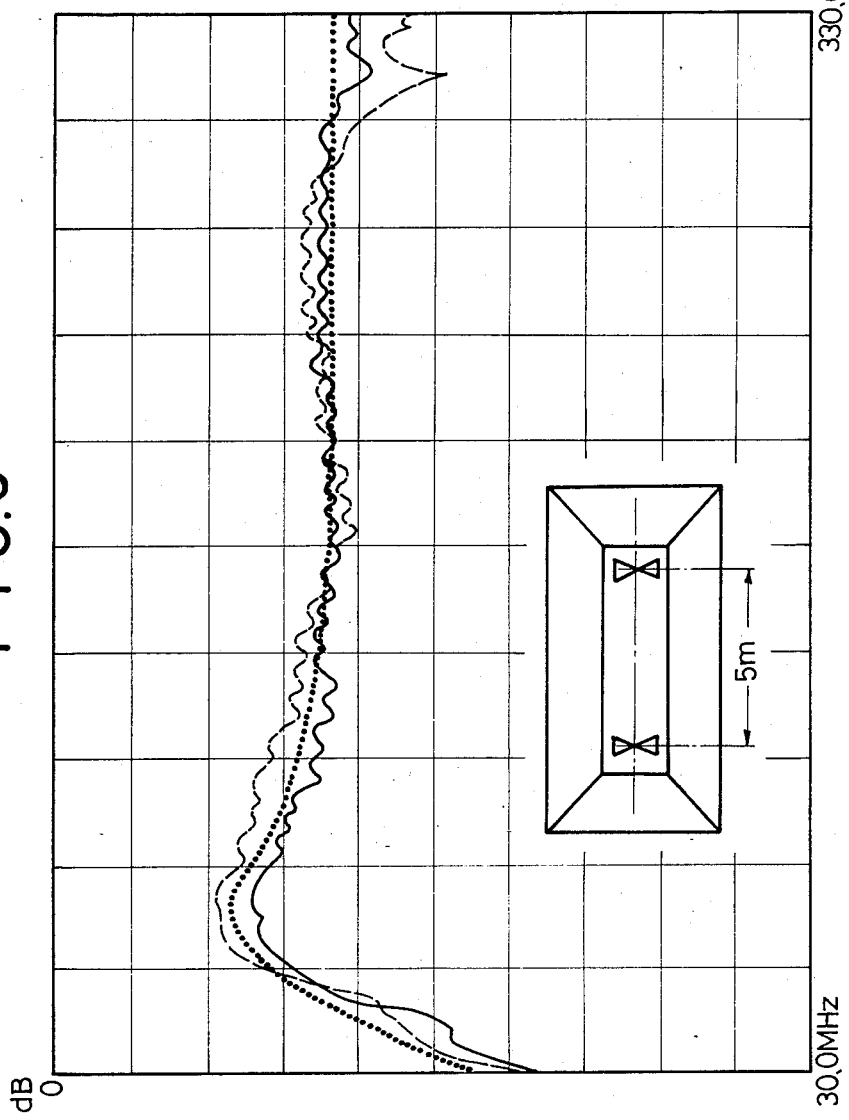

RADIO-FREQUENCY ANECHOIC CHAMBER

FIELD OF THE INVENTION

The present invention relates to a radio-frequency anechoic chamber (electro-magnetic wave nonreflecting room) which is used to obtain data for electromagnetic environmental countermeasures or for measuring the electromagnetic compatibilities of various kinds of electronic equipment, that is, the capabilities at which various kinds of electronic equipment can operate at prescribed efficiencies in an electromagnetic environment or by measuring the electromagnetic interference due to generated electromagnetic noise from inside of various kinds of electronic equipments.

DESCRIPTION OF THE RELATED BACKGROUND ART

A conventional radio-frequency anechoic chamber is constructed in such a manner that radiowave absorbers, each of which has the shape of a triangular pyramid or a serrate cone (deformed triangular pyramid), and is formed by laminating a plurality of sheets made of, for instance, foam polyethylene containing carbon at different contents, are provided for all inside of the peripheral walls and for the entire ceiling surface without a gap.

In radio-frequency anechoic chamber, the frequencies of the radiowaves which are presently used in the case of measuring electromagnetic compatibility, electromagnetic interference or the like fall within the range of about 30 MHz to 1000 MHz (a wavelength range of about 10 meters to 0.3 meter).

Therefore, the height of each of the radio-wave absorbers having the shape of the triangular pyramid or serrate cone (deformed triangular pyramid) arranged for all inside of the peripheral walls and the entire ceiling surfaces in a radio-frequency anechoic chamber needs to be set to a value from $\frac{1}{2}$ to $\frac{1}{4}$ of the maximum wavelength (from about 5 meters to 2.5 meters) of the radio wave. Since each of the radio-wave absorbers is large in size, the volume of the radio-frequency anechoic chamber must be large. Either is the area which is needed to construct the radio-frequency anechoic chamber.

On the other hand, it is economically difficult to provide a radiowave absorber which can completely absorb electric waves. The radiowave absorber which is generally used reflects a part of the radiowaves and the reflection effect differs according to the frequency of the radiowaves. Therefore, it is difficult to obtain a good frequency characteristic over a wide range.

Further, the presence of apparatuses or persons other than the EUP(equipment under test) in the radio-frequency anechoic chamber makes ignorable the influences which are exerted on the results of the measurement. Therefore, another room for isolating apparatuses (measuring equipment) other than the EUP and a room for persons need to be provided separately from the radio-frequency anechoic chamber. The existence of this room, thus, increases the construction cost and area.

SUMMARY OF THE INVENTION

It is, therefore, an object of the present invention to provide a radio-frequency anechoic chamber with less volume and unnecessity of a room for isolating apparatuses other than the EUP and a room for persons need to be provided separately from the radio frequency anechoic chamber, so that the area is also reduced.

Another object of the invention is to provide a radio-frequency anechoic chamber having a good frequency characteristic over a wide range.

The radio-frequency anechoic chamber of the present invention comprises:
  radiowave reflectors provided for all inside of the peripheral walls whose upper portion is opened in a manner such that the reflecting surfaces are obliquely upwardly arranged; and
  a screen to cut off the reflected waves which is arranged between an antenna and the mounting table of a EUP and has a gap for allowing only the direct waves from the antenna to pass.

The radio-frequency anechoic chamber of the invention comprises:
  radiowave reflectors provided on all inside of the peripheral walls in a manner such that the reflecting surfaces are obliquely upwardly arranged;
  a screen to cut off the reflected waves which is arranged between an antenna and a mounting table of a EUP and has a gap for allowing only the direct waves from the antenna to pass;
  a radiowave reflector which forms a triangular prism together with the floor surface and whose longitudinal direction coincides with the direction connecting the antenna and the mounting table of the EUP and which is provided on the floor surface in such a manner that the reflecting surface is obliquely upwardly arranged;
  a radiowave reflector which forms a triangular prism together with the ceiling surface and whose longitudinal direction coincides with the direction connecting the antenna and the mounting table of the EUP and which is provided under the ceiling surface in such a manner that the reflecting surface is obliquely downwardly arranged; and
  radiowave absorbers provided under the ceiling surface where no radiowave reflector is provided.

DETAILED DESCRIPTION OF THE PREFERRED EMBODIMENTS

Figure 1:
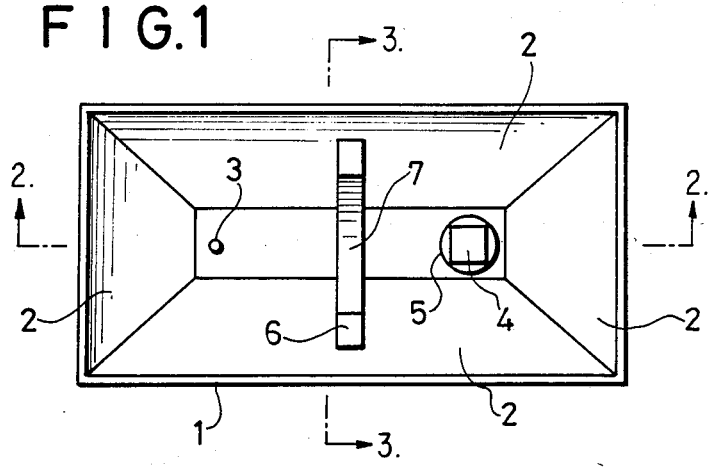
FIG. 1 is a plan view showing an embodiment of the present invention.

The radio-frequency anechoic chamber according to an embodiment of the invention comprises: radiowave reflectors 2 which are provided for all inside surfaces of peripheral walls 1 whose upper portion is opened in such a manner that the reflecting surfaces are obliquely upwardly arranged; and a screen 6 to cut off the reflected waves which is arranged between an antenna 3 and a mounting table 5 of a test apparatus 4 and has at its center a U-shaped gap 7 for allowing only direct waves from the antenna 3 to pass.

The radiowave reflectors 2 are provided for all inside of the peripheral walls 1 in such a manner that the reflecting surfaces are obliquely upwardly arranged. However, as the angle between the reflecting surface and the floor surface decreases and as the height of the upper edge of the reflecting surface increases, the performance can be improved.

However, when considering economical efficiency, it is desirable to set the angle between the reflecting surface and the floor surface to a value ranging from about 70° to 25°. On the other hand, the height of the upper edge of the reflecting surface is suitably set to be higher than the upper edge of the antenna 3.

As the material of the radio wave reflector 2, it is possible to use any material which can smoothly form the reflecting surface without passing through the radiowaves. For instance, the reflecting plate 2 may be formed by using a metal plate of aluminum, iron, copper or the like, or may be formed by adhering a conductive sheet to the surface of commercially available construction materials or the like.

The screen 6 to cut off the reflected waves is arranged between the antenna 3 and the test apparatus 4 in such a manner that the test apparatus 4 (or antenna 3) can be seen from the direction of the antenna 3 (or test apparatus 4) through the gap 7.

As the material of the screen 6, it is possible to use any material through which radiowaves cannot be passed through. Similar to the radiowave reflector 2, the screen 6 may be formed by using a metal plate such as aluminum, iron, copper or the like, or may be also formed by adhering a conductive sheet to the surface of a commercially available construction materials or the like.

The installed relation between the reflectors 2 and the screen 6 will now be described. Even if the screen 6 is omitted, no problem will occur in the case that radiowaves in the VHF band in which the difference between the propagation path of the direct waves which reach from the antenna 3 to the test apparatus 4 and the propagation path of the reflected waves (that is, the difference between the paths of the direct waves and the reflected waves) is set to ½ wavelength or shorter, are used for testing. However, in the case that the difference between the paths of the direct waves and the reflected waves is longer than ½ wavelength and the reflection coefficient is large, the screen 6 needs to be provided. The size of gap 7 is set so that the image of a partner object which is projected onto the reflectors 2 of all of the radiowaves is not clearly seen in the case of seeing the test apparatus 4 from the direction of the antenna 3 or of seeing the antnna 3 from the direction of the test apparatus 4.

Although the case where the upper portion of the peripheral walls 1 is held open has been shown in the diagram as an example, it is desirable to attach a roof made of a material which can prevent the entry of rain and snow without obstructing the propagation of the radiowaves.

The operation of the radio-frequency anechoic chamber in the embodiment will now be described.

In the case that the screen 6 is omitted, the parts of the radiowave which are generated from the antenna 3 and reach the test apparatus 4 comprise direct waves, waves reflected from the floor surface, and waves reflected from the reflectors 2. However, in the radio-frequency anechoic chamber, since the screen 6 to cut off the reflected waves is arranged between the antenna 3 and the test apparatus 4, part of the waves reflected from the reflectors 2 and the waves reflected from the floor surface are blocked by the screen 6. Part of the waves reflected from the reflectors 2 propagate upward and irradiated from the upper opening portion of the radio-frequency anechoic chamber to the sky.

Since the sky is an ideal radiowave absorber. the radiowaves which propagated upward never return to the radio-frequency anechoic chamber.

Therefore, the propagated radiowave part which reaches from the antenna 3 to the test apparatus 4 comprises only direct waves.

Since the propagation of the radiowaves is reversible, even in the case that the radio noise caused in the test apparatus 4 are received by the antenna 3, only direct waves are also received in the same manner.

Another embodiment of the invention will now be described with reference to FIGS. 4 to 6.

Figure 2:
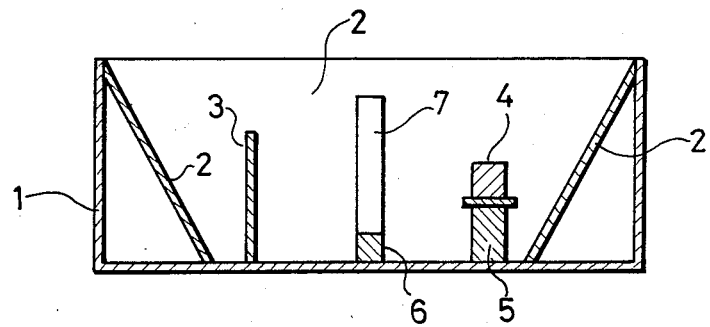
FIG. 2 is a cross sectional view taken along line A—A in FIG. 1.
Figure 3:
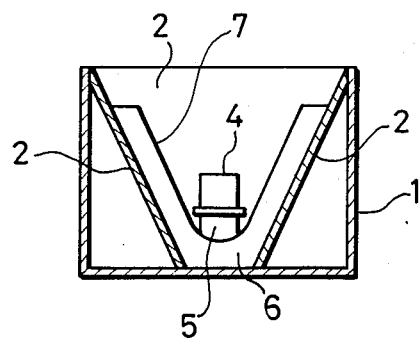
FIG. 3 is a cross sectional view taken along line B—B in FIG. 1.

In the diagrams, the peripheral walls 1, electric wave absorbers 2, antenna 3, test apparatus 4, and mounting plate 5 of the test apparatus 4 are constructed in the same manner as to those shown in FIGS. 1 to 3.

The construction of the embodiment differs from that of the foregoing embodiment with respect to the screen 6 to cut off the reflected waves. That is, in the embodiment, an almost circular gap 8 is formed in place of the almost U-shaped gap 7. The material of the screen 6, the installed relation of the screen 6 and the reflectors 2, and the like are substantially the same as those in the above embodiment. A radiowave reflector 9 is provided so as to form a triangular prism by two reflecting plates and the floor surface. The reflector 9 is arranged on the floor surface so that the longitudinal direction coincides with the direction connecting the antenna 3 and the test apparatus 4. The material of the reflector 9, the angle between the reflecting surface and the floor surface, and the like are similar to those in the reflector 2. A radiowave reflector 10 is provided so as to form a triangular prism by two reflecting plates and the ceiling surface. The reflector 10 is arranged under the ceiling surface so that the longitudinal direction coincides with the direction connecting the antenna 3 and the test apparatus 4. The material of the reflector 10, the angle between the reflecting surface and the floor surface, and the like are similar to those in the reflector 2. Radiowave absorbers 11 are made of absorbers having a construction similar to conventional ones and are arranged in all portions of the ceiling surface where no radiowave reflector 10 is provided.

In the embodiment, since the radiowave reflector 9 is also provided on the floor surface, the reflection of the radiowaves from the floor surface can be reduced. On the other hand, a part of the radiowaves which propagate upward are reflected by the reflector 10 and absorbed by the absorbers 11. A part of the radiowaves which propagate upward are directly absorbed by the absorbers 11. The other radiowave propagation are similar to those in the foregoing embodiment. Only the direct waves from the antenna 3 reach the test apparatus 4. Although not shown, a roof can be attached over the ceiling as necessary.

In the radio-frequency anechoic chamber of the invention, the reflected waves other than the direct waves between the antenna 3 and the test apparatus 4 mainly propagate upward. In the embodiment shown in FIGS.

1 to 3, the reflected waves which propagate upwardly are irradiated into the sky and never return to the radiofrequency unechoic chamber. In the embodiment shown in FIGS. 4 to 6, a part of the reflected waves which propagate upward are reflected by the radiowave reflector 10 and absorbed by the absorbers 11. Since a part of the reflected waves which propagate upward are directly absorbed by the absorber 11, only the direct waves reach the test apparatus 4. This causes a good radiation stability of the radiowaves, almost no standing waves due to the repetitive reflection, and adverse influence is exerted on the impedance of the antenna 3. Consequently, there is almost no fear of the measurement erroneous occurrence.

The size, shape, absorbing ratio, and the like of the conventional radiowave absorber vary depending on the wavelengths of the radiowaves. However, in the case of the radiowave reflectors which are used in the present invention, the wide range property is good, the structure is simple, and there is almost no fear that the electrical characteristic will be influenced by the working accuracy.

Since the space between the peripheral walls 1 in the radio-frequency anechoic chamber according to the invention and the radiowave reflectors 2 provided on the inside of the peripheral walls 1 is electrically isolated, it can be effectively used as a place for measuring equipments, as space for installing air-conditioning equipment, as a preparation room, or the like. Thus, there is no need to provide another room as in conventional dark rooms.

According to the radio wave dark room of the invention, the structure is simple, the component materials are inexpensive and the area is small. Therefore, construction costs and constructing period can be remarkably reduced.

Figure 4:
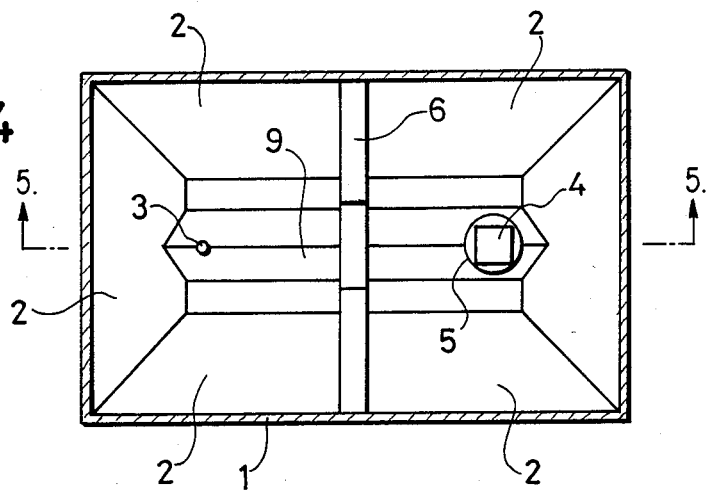
FIG. 4 is a cross sectional view (taken along line B—B in FIG. 5) showing another embodiment of the invention.
Figure 5:
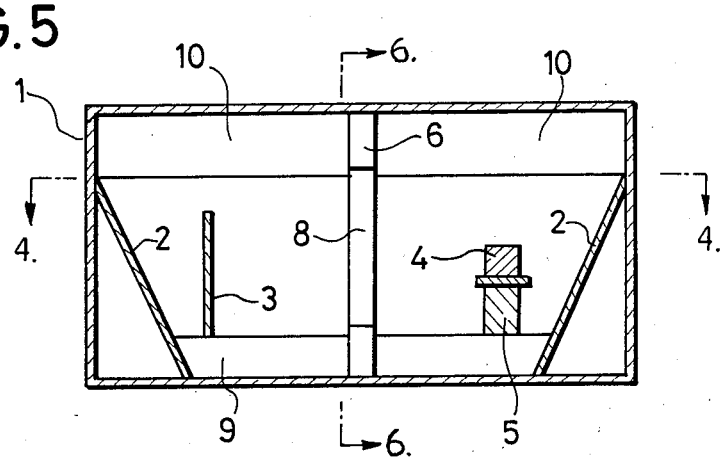
FIG. 5 is a cross sectional view taken along line A—A in FIG. 4.
Figure 6:
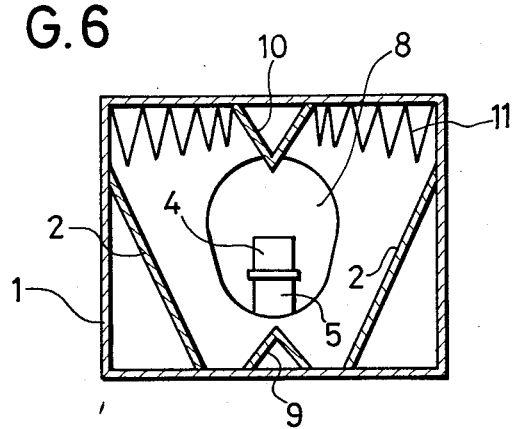
FIG. 6 is a cross sectional view taken along line C—C in FIG. 5, and FIGS. 7 and 8 are diagrams explaining the suppressing effect of unnecessary reflected waves in the radiowave dark room of the invention.

Since the radio-frequency anechoic chamber of the embodiment shown in FIGS. 4 to 6 is of the type with shielding effect, it can be also installed at the location among high intensity radiowaves, such as in the middle floors in buildings in large cities.

FIGS. 7 and 8 are curves explaining the suppressing effect of unnecessary reflected waves in the radio-frequency anechoic chamber according to the invention. In the diagrams, the abscissa represents a transmitting frequency range (MHz) in which one division corresponds to 30 MHz, the ordinate represents a propagation loss (dB) in which one division corresponds to 10 dB, the solid line shows an actually measured value of the horizontal polarization, and the broken line represents an actually measured value of the vertical polarization, equivalent theoretical free-space value and the broke line represents an equivalent, theoretical free-space value.

FIG. 7 shows the actually measured values of the propagation loss characteristic within a frequency range from 30 MHz to 300 MHz in the case that two reflectors each having a width of 5 meters and a height of 2.5 meters are vertically attached so as to be separated from each other by 10 meters in the free-space between buildings, and a biconical antenna for transmission and a biconical antenna for reception are arranged at a distance of 5 meters between the reflectors. As will be obvious from the graph, there are standing waves or irregular waves whose amplitudes exceed 20 dB between peak to dip.

FIG. 8 shows an example of the actually measured values of the propagation loss in the same frequency range as that in FIG. 7 in the case that two reflectors, whose upper edge heights are set to 1.77 meters, are arranged at an angle of 45° against the ground plane to thereby surround the biconical antennas attached at the same location and under the same conditions as those in the case of FIG. 7.

As will be obvious from the diagram, most of the large standing waves are suppressed, and the propagation loss approaches the free-space value because of the direct waves by a within a few dB.

What is claimed is:

1. A radio-frequency anechoic chamber comprising:
   radiowave reflectors (2) which are provided on all inside of peripheral walls (1) whose upper portion is opened in a manner such that their reflecting surfaces are obliquely upwardly arranged and
   a screen (6) to cut off reflected waves which is arranged between an antenna (3) and a mounting table (5) of a test apparatus (4) and has a gap (7) for allowing only the direct waves from said antenna (3) to pass.

2. A radio-frequency anechoic chamber comprising:
   radiowave reflectors (2) which are provided on all inside of peripheral walls (1) in such a manner that their reflecting surfaces are obliquely upwardly arranged;
   a screen (6) to cut off reflected waves which is arranged between an antenna (3) and a mounting table (5) of a test apparatus (4) and which has a gap (8) for allowing only the direct waves from said antenna (3) to pass;
   a radiowave reflector (9) which forms a triangular prism together with the floor surface and whose longitudinal direction coincides with the direction connecting the antenna (3) and the mounting table (5) of the test apparatus (4) and which is provided on the floor surface in such a manner that its reflecting surface is obliquely upwardly arranged;
   a radiowave reflector (10) which forms a triangular prism together with the ceiling surface and whose longitudinal direction coincides with the direction connecting the antenna (3) and the mounting table (5) of the test apparatus (4) and which is provided under the ceiling surface in such a manner that its reflecting surface is obliquely downwardly arranged; and
   radiowave absorbers (11) provided under the ceiling surface where said radiowave reflector (10) is not provided.

* * * * *

UNITED STATES PATENT AND TRADEMARK OFFICE
CERTIFICATE OF CORRECTION

PATENT NO. : 4,906,998
DATED : March 6, 1990
INVENTOR(S) : SHIGEKAZU SHIBUYA

It is certified that error appears in the above-identified patent and that said Letters Patent is hereby corrected as shown below:

On the title page, item [73], in the Assignee, please delete delete "Yoshiaki Kaneko, Kawasaki, Japan" and insert --Yoshiaki Kaneko (part interest)--.

Signed and Sealed this

Twenty-first Day of April, 1992

Attest:

HARRY F. MANBECK, JR.

*Attesting Officer*      *Commissioner of Patents and Trademarks*